United States Patent [19]
Zhang

[11] Patent Number: 5,254,208
[45] Date of Patent: Oct. 19, 1993

[54] METHOD FOR MANUFACTURING A SEMICONDUCTOR DEVICE

[75] Inventor: Hongyong Zhang, Kanagawa, Japan

[73] Assignee: Semiconductor Energy Laboratory Co., Ltd., Kanagawa, Japan

[21] Appl. No.: 729,999

[22] Filed: Jul. 15, 1991

[30] Foreign Application Priority Data

Jul. 24, 1990 [JP] Japan .................. 2-195173
Jul. 28, 1990 [JP] Japan .................. 2-199979
Jul. 28, 1990 [JP] Japan .................. 2-199980

[51] Int. Cl.$^5$ .............................. C30B 1/08
[52] U.S. Cl. .................. 156/603; 156/DIG. 73; 156/DIG. 89; 437/21; 437/101; 437/174; 437/247
[58] Field of Search ....... 156/603, DIG. 73, DIG. 89; 437/21, 101, 174, 247

[56] References Cited

U.S. PATENT DOCUMENTS

| | | | |
|---|---|---|---|
| 4,214,919 | 7/1980 | Young | 156/DIG. 89 |
| 4,565,584 | 1/1986 | Tamura et al. | 156/DIG. 73 |
| 4,575,925 | 3/1986 | Kabara et al. | 437/21 |
| 4,592,799 | 6/1986 | Hayafuji | 156/DIG. 73 |

FOREIGN PATENT DOCUMENTS

| | | |
|---|---|---|
| 58-182243 | 10/1983 | Japan . |
| 61-078119 | 4/1986 | Japan . |
| 62-030314 | 2/1987 | Japan . |
| 63-240524 | 10/1988 | Japan . |
| 1-196116 | 8/1989 | Japan . |
| 2-044022 | 2/1990 | Japan . |

OTHER PUBLICATIONS

Extended Abstracts of the 20th. Int. Conf. on Solid State Dev. and Materials, (Aug. 24, 1988), Tokyo, pp. 619–620; K. Nakazawa et al.: "Low Temperature Thin Film Transistor Fabricationusing a Polycrystalline Silicon Film Formed from a Fluorinated Silicon Film".
IEEE Electron Device Letters, vol. 11, No. 6, (Jun. 1990), New York, U.S., pp. 258–260; Hiroshi Kanoh et al.: "Amorphous–Silicon/Silicon–Nitride Thin–Film Transistors Fabricated by Plasma–Free (Chemical Vapor Deposition) Method".

Primary Examiner—Robert Kunemund
Assistant Examiner—Felisa Garrett
Attorney, Agent, or Firm—Sixbey, Friedman, Leedom & Ferguson

[57] ABSTRACT

A semiconductor device is manufactured by the use of a glass substrate which has previously been heated. An amorphous semiconductor layer is formed on the previously heated glass substrate and then crystallized by heat. By virtue of the previous heating, shrink of the glass substrate after the crystallization process is reduced. Accordingly, internal stress is not generated in the crystallized semiconductor layer. The semiconductor device thus manufactured is superior in electrical property.

11 Claims, 21 Drawing Sheets

F I G. 1
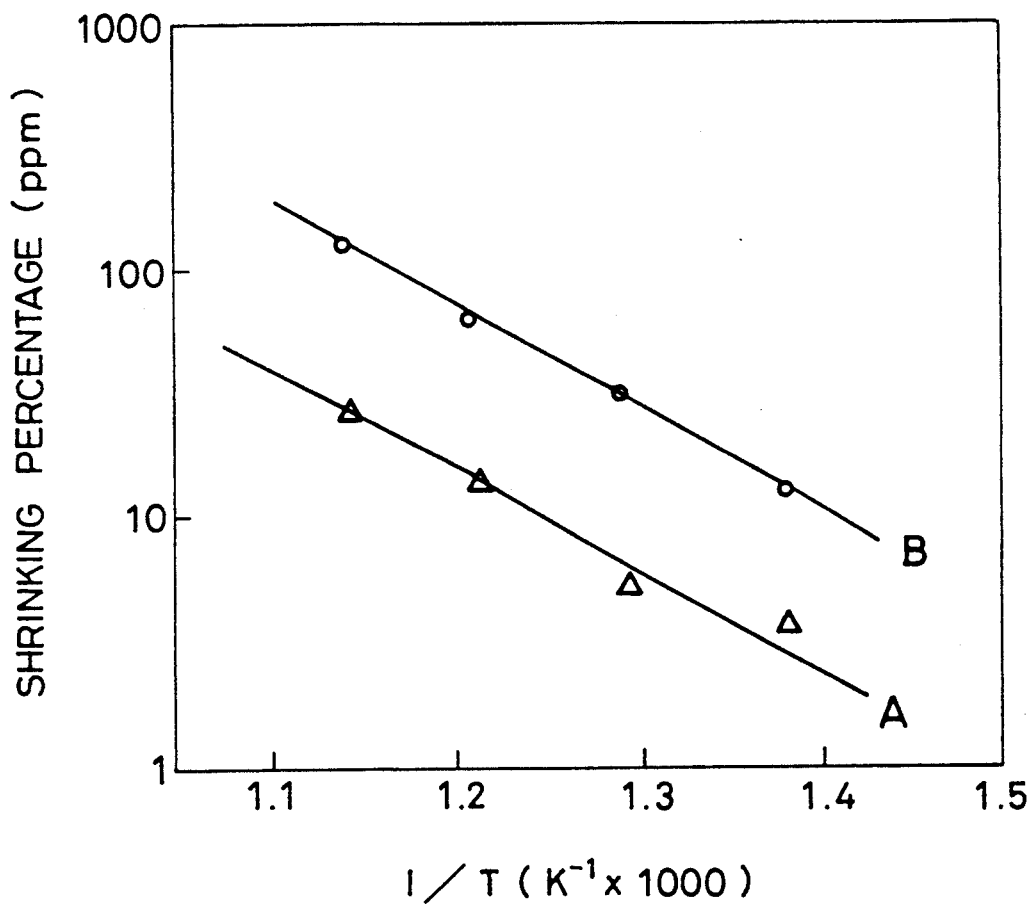

METHOD FOR MANUFACTURING A SEMICONDUCTOR DEVICE

BACKGROUND OF THE INVENTION

1. Field of the Invention

The present invention relates to a method for manufacturing a semiconductor device.

2. Description of the Prior Art

A technique of forming a non-single crystal semiconductor layer on a glass substrate by reduced pressure CVD or plasma CVD followed by heating the substrate at about 600° C. to thereby crystallize the layer into a polycrystal semiconductor layer has been well-known in the field of manufacture of semiconductor devices. Explaining the process of this thermal crystallization, first the temperature is raised from room temperature (i.e. initial stage), second the temperature is maintained at about 600° C. (i.e. intermediate stage) for a few hours to several tens hours, and finally the temperature is lowered to room temperature (i.e. last stage). If a cheap glass substrate utilized for a large-sized liquid crystal display device and so on is subjected to the thermal crystallization process at about 600° C., since a cheap glass substrate has its strain point at about 600° C., the glass substrate shrinks (that is, the volume of the glass at the last stage becomes smaller than that at the initial stage) and thereby internal stress is caused in a semiconductor layer provided on the substrate. Further, photolithography pattern to be used in the subsequent process is deformed due to the shrink of the glass substrate, so that mask alignment in the further subsequent process becomes difficult to carry out. According to an experiment, interface state in the semiconductor layer formed on the substrate was high due to the internal stress, therefore electrical property of the semiconductor layer was bad. For the above reason, a technique for obtaining on a glass substrate a semiconductor layer of excellent electrical property has been required in the field of manufacture of semiconductor devices.

SUMMARY OF THE INVENTION

It is an object of the present invention to provide a method for manufacturing a semiconductor device of high performance.

It is another object of the present invention to provide a semiconductor device comprising a channel region of high field effect mobility.

It is a further object of the present invention to provide a semiconductor device of high performance.

In order to attain these and other objects, first a glass substrate is heated in a non-oxidizing atmosphere or an inactive gas atmosphere at a temperature not higher than strain point of the glass substrate, and then a non-single crystal semiconductor layer is formed on the substrate and the non-single crystal semiconductor layer is crystallized by heat in a non-oxidizing atmosphere or an inactive gas atmosphere. The volume of the glass substrate at a temperature, e.g., room temperature after the glass substrate heating process is smaller than that at the same temperature as the above, e.g., room temperature before the glass substrate heating process. That is, the glass substrate shrinks after being heated. By virtue of this glass substrate heating process, when the non-single crystal semiconductor layer formed on the glass substrate is crystallized by heat, the volume of the glass substrate is not decreased so much, that is, the shrink of the glass substrate is very little.

Therefore, a crystallized semiconductor layer free from internal stress can be obtained by the crystallization process.

A non-single crystal semiconductor includes an amorphous semiconductor, a semi-amorphous semiconductor, a microcrystal semiconductor, and an imperfect polycrystal semiconductor. The microcrystal semiconductor is defined as a semiconductor in amorphous state in which crystal state is dispersed. On the other hand, the imperfect polycrystal semiconductor is defined as a semiconductor in polycrystal state in which crystal growth is imperfect, that is, crystals can be grown more.

Strain point of glass is defined as the temperature at which the viscosity of glass $v$ is $4 \times 10^{14}$ poise ($\log(v) = 14.5$).

BRIEF DESCRIPTION OF THE DRAWINGS

The present invention will now be described with reference to the accompanying drawings wherein:

FIG. 1 is a graphical view showing the relationship between shrinking percentage of a glass substrate and temperature;

DETAILED DESCRIPTION OF THE PREFERRED EMBODIMENTS

Figure 2:
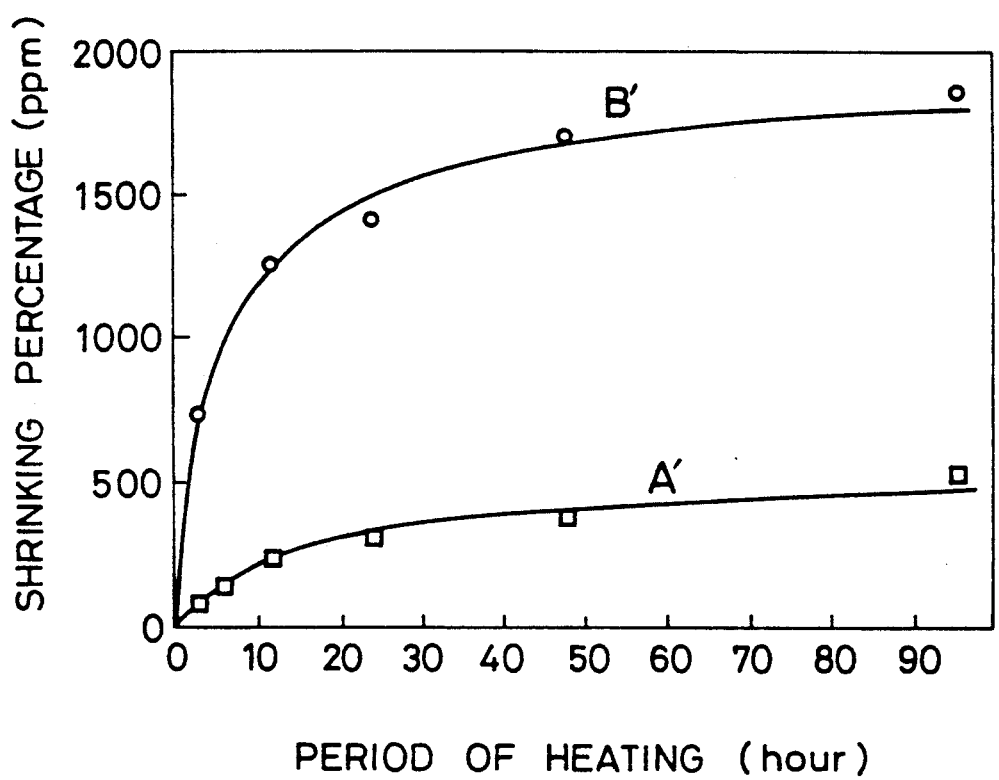
FIG. 2 is a graphical view showing the relationship between shrinking percentage of a glass substrate and period of heating.

Formation of a semiconductor layer on a substrate in accordance with a first embodiment of the present invention will be described hereinafter. The substrate used in the first embodiment was "AN-2" non-alkali glass produced by Asahi Glass Company, whose strain point is 616° C. AN-2 non-alkali glass comprises $SiO_2$ (53%), $Al_2O_3$ (11%), $B_2O_3$ (12%), RO (24%), and $R_2O$ (0.1%). The glass substrate was heated at 610° C. for 12 hours in an electrical furnace. This glass substrate heating was carried out in an inactive gas atmosphere, e.g. $N_2$, under an atmospheric pressure.

After the heating, a silicon compound layer, e.g. $SiO_2$ layer, was formed to be 200 nm thick by sputtering in order to provide a blocking layer for preventing alkali ions residing in the glass substrate from entering a device to be formed on the substrate. Then an amorphous silicon layer was formed thereon to be 100 nm thick. The amorphous silicon layer was then heated at 600° C. for 96 hours in an electrical furnace to thereby be crystallized. The crystallization was carried out in an inactive gas atmosphere, e.g. $N_2$, under an atmospheric pressure, in order to prevent the amorphous silicon layer from reacting with a gas, e.g. oxygen.

Relationship between shrinking percentages and temperatures is examined as follows.

Glass substrates A ("AN-2" non-alkali glass) which had been heated in advance in the same manner as in the first embodiment were prepared. Also, glass substrate B ("AN-2" non-alkali glass) which had never been heated were prepared. First, volume of each substrate was measured at room temperature (the volume obtained is referred to as $V_1$). Then these glass substrates were heated at various temperatures for 12 hours. After the heating process, volume of each substrate was measured again at room temperature (the volume obtained is referred to as $V_2$). Then, shrinking percentage of each substrate was calculated by the volume $V_1$ and the volume $V_2$ of each substrate. Relationship between the shrinking percentages of the heated glass substrates A and the temperatures is shown by line A in FIG. 1, while that in the case of the glass substrates B is shown by line B. As apparent from FIG. 1, the shrinking percentages of the glass substrates A heated in advance are 1/5 or less of those of the glass substrates B. It is also found that the shrinking percentage tends to be increased exponentially in accordance with the increase of the temperature. When manufacturing a thin film transistor, since the shrink of previously heated glass substrates after crystallization process is 1/5 or less compared with the shrink of not heated glass substrates after crystallization process, error in mask alignment in the subsequent photolithography process in the case of the previously heated glass substrates becomes 1/5 or less compared with that in the case of the non-heated glass substrates. Therefore, it becomes possible to manufacture a large-sized thin film transistor by one step.

Next, relationship between shrinking percentages and periods of heating process is examined.

Glass substrates A' ("AN-2" non-alkali glass) which had been heated in advance in the same manner as in the first embodiment and glass substrates B' ("AN-2" non-alkali glass) which had never been heated were prepared. First, volume of each substrate was measured at room temperature (the volume obtained is referred to as $V_1$). Then these glass substrates were heated at 600° C. for various periods of time. After the heating process, volume of each substrate was measured again at room temperature (the volume obtained is referred to as $V_2$). Then, shrinking percentage of each substrate was calculated by the volume $V_1$ and the volume $V_2$ of each substrate. Relationship between the shrinking percentages of the heated glass substrates A' and the periods of heating is shown by curve A' in FIG. 2, while that in the case of the glass substrates B' is shown by curve B'. As apparent from FIG. 2, the glass substrates shrink within the first several hours of the heating process, and the curves A' and B' have a tendency to be saturated with the passage of the time of heating. In the case of the heating for 96 hours, the shrink of the glass substrate B' is about 2000 ppm, while that of the glass substrate A' is only about 500 ppm. It is obvious from FIGS. 1 and 2 that, when manufacturing a thin film transistor, the shrink of a glass substrate after crystallization process can be decreased by heating a glass substrate in advance.

Figure 3:
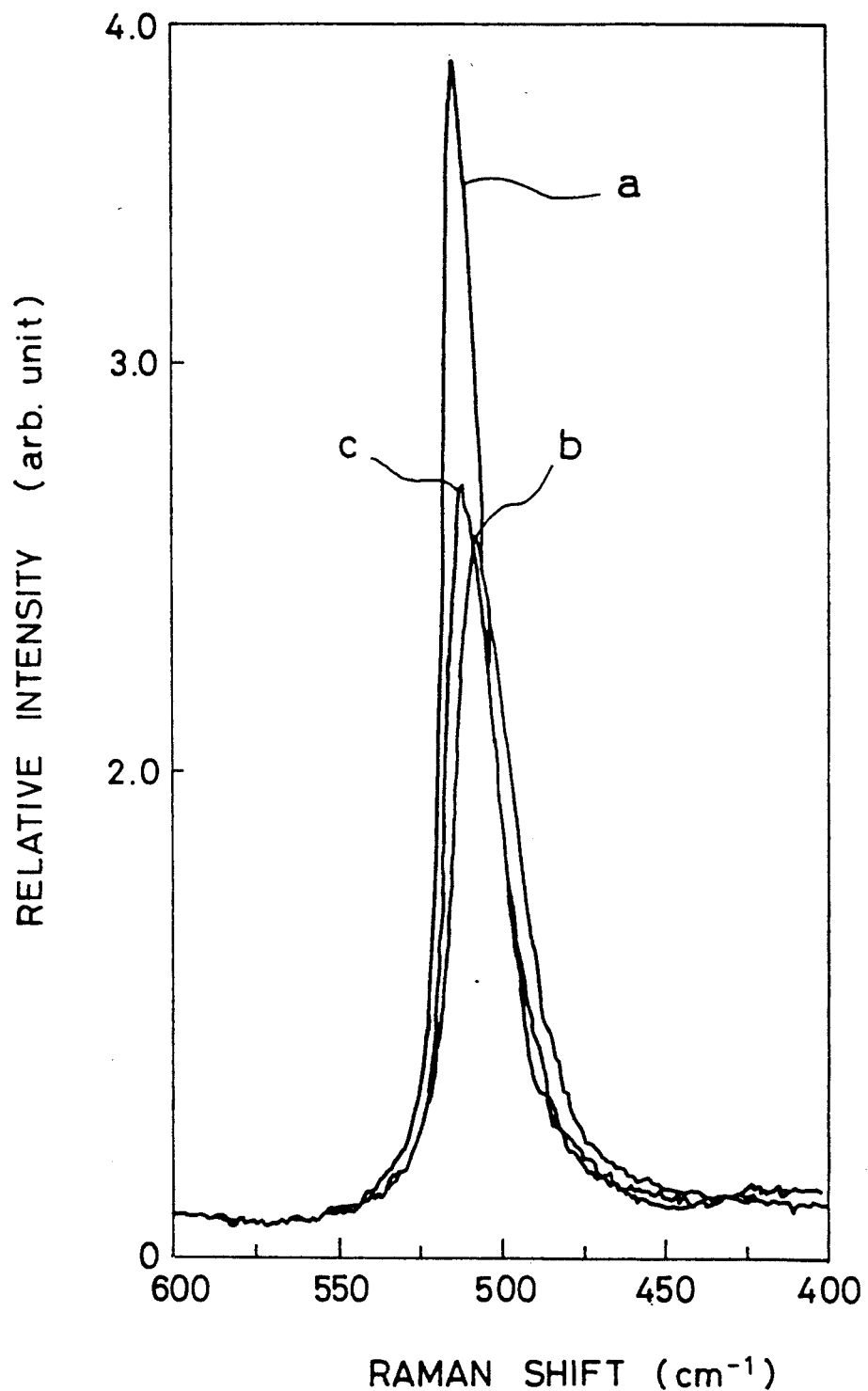
FIG. 3 is a graphical view showing relative intensity in laser Raman spectroscopic analysis for semiconductor layers.

FIG. 3 shows relative intensity in Raman spectroscopic analysis for semiconductor layers. In the figure, curve a indicates that for a silicon semiconductor layer (a) crystallized in accordance with the first embodiment. Curve b indicates that for a semiconductor layer (b) which was formed in the same manner as in the first embodiment except that a glass substrate (AN-2 non-alkali glass) which had never been heated was utilized instead of the previously heated glass substrate. Also, curve c indicates that for a semiconductor layer (c) which was formed in the same manner as in the first embodiment except that a quartz substrate was utilized instead of the previously heated AN-2 non-alkali glass substrate. The ordinate in FIG. 3 shows the relative strength of crystallinity of semiconductor layers. As apparent from FIG. 3, the crystallinity of the silicon semiconductor layer (a) obtained in accordance with the first embodiment is far stronger than that of the semiconductor layers (b) and (c). The semiconductor layers (a) and (c) show sharp peaks at the same wavenumber respectively, and the location of these sharp peaks is peculiar to polycrystal silicon. Accordingly, the semiconductor layer (c) formed on the quartz substrate as well as the semiconductor layer (a) formed in accordance with the first embodiment is polycrystal of high crystallinity. In the silicon semiconductor layer (a), internal stress generated by the crystallization process is very little by virtue of the previous heating of the glass substrate. As in the foregoing description, the previous heating of a glass substrate at a temperature not higher than strain point of the glass substrate is advantageous: The shrink of a glass substrate after crystallization process is very little and internal stress generated in a crystallized semiconductor layer is very little, whereby crystallinity and electrical property are improved.

With respect to the semiconductor layer (b), a sharp peak thereof appears at a location slightly different from that peculiar to polycrystal silicon, as shown in FIG. 3. This is because the property of the semiconductor layer (b) was affected by internal stress generated therein.

Activation energy for the "AN-2" non-alkali glass is about 0.08 eV, which is equivalent to transition point of the glass (668° C.). The activation energy is calculated with the formula indicating the straight line in FIG. 1, $R = A \exp(-E_a/kT)$ where A is proportional constant, $E_a$ is activation energy, and k is Boltzmann's constant.

The glass substrate heating may be carried out under a reduced pressure, instead of an atmospheric pressure.

Referring next to FIGS. 4(A) through 4(E), manufacture of a polycrystal silicon thin film transistor will be described in accordance with a second embodiment of the present invention.

A glass substrate ("AN-2" non-alkali glass) 1 was heated at 610° C. for 12 hours in an electrical furnace. This heating was carried out in an inactive gas atmosphere, e.g. $N_2$, under an atmospheric pressure. It may be done in an inactive gas atmosphere involving an additive of hydrogen under an atmospheric pressure or a reduced pressure, instead.

On the glass substrate 1, a silicon compound layer 2, e.g. $SiO_2$ layer, was formed to be 200 nm thick by RF sputtering method. The formation was carried out under conditions of a pressure of 0.5 Pa, a temperature of 100° C., an RF frequency of 13.56 MHz, and an RF output power of 400 W.

Then, an amorphous silicon activation layer 3 was formed to be 100 nm thick on the silicon compound layer by RF sputtering. In this case, the formation was carried out under a pressure of 0.5 Pa at a temperature of 150° C. at an RF frequency of RF of 13.56 MHz at an RF output power of 400 W.

The amorphous silicon layer 3 was then crystallized by heat at 400° C. to 800° C., typically 500° C. to 700° C., e.g. 600° C., for 96 hours in an inactive gas atmosphere, e.g. $N_2$, under an atmospheric pressure. This crystallization process may be carried out under a high vacuum condition.

Figure 4A:
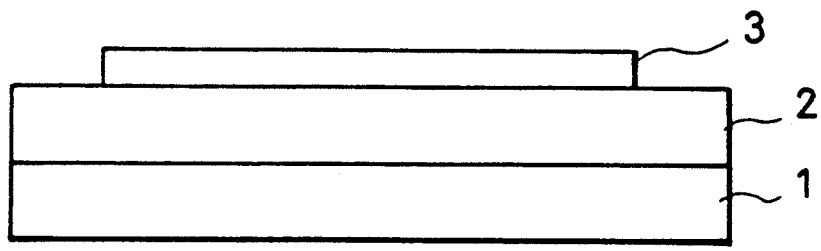
FIGS. 4(A) through (E) are schematic cross sectional views showing a method for manufacturing a thin film transistor in accordance with the present invention.

The crystallized silicon layer 3 was partially removed so that the pattern shown in FIG. 4(A) was obtained.

Figure 4B:
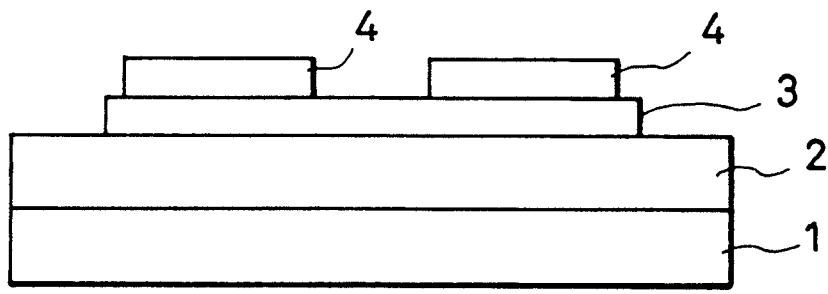

Subsequently, an n+-type amorphous silicon layer 4 was formed to be 50 nm thick by PCVD under a pressure of 6.65 Pa at a temperature of 350° C. at an RF frequency of 13.56 MHz at an RF output power of 400 W at the ratio of $PH_3$ (5%):$SiH_4$:$H_2$ = 0.2 SCCM:0.3 SCCM:50 SCCM. The silicon layer 4 was then partially removed so that a gate region was formed as shown in FIG. 4(B).

Figure 4C:
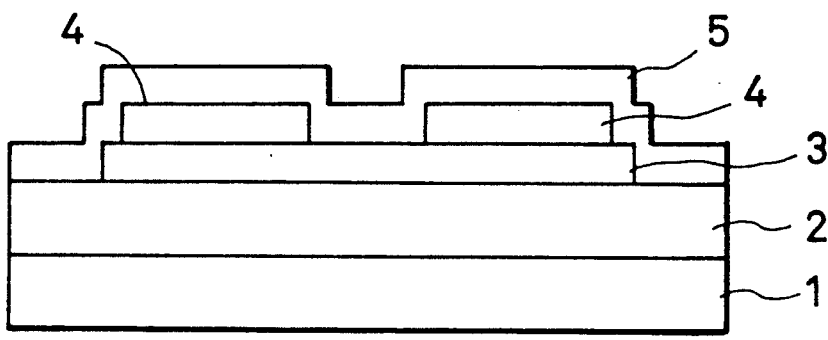
Figure 4D:
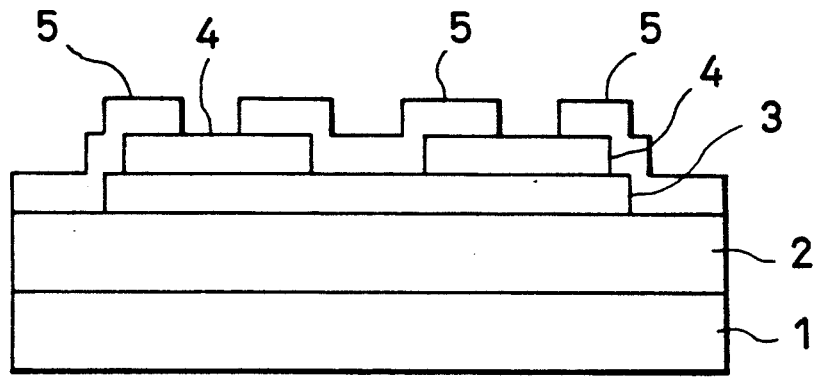

A gate oxide film ($SiO_2$) 5 was formed to be 100 nm thick by sputtering as shown in FIG. 4(C), under conditions of a pressure of 0.5 Pa, a temperature of 100° C., an RF frequency of 13.56 MHz, and an RF output power of 400 W. Then the gate oxide film 5 was partially removed to thereby form contact holes as shown in FIG. 4(D).

Figure 4E:
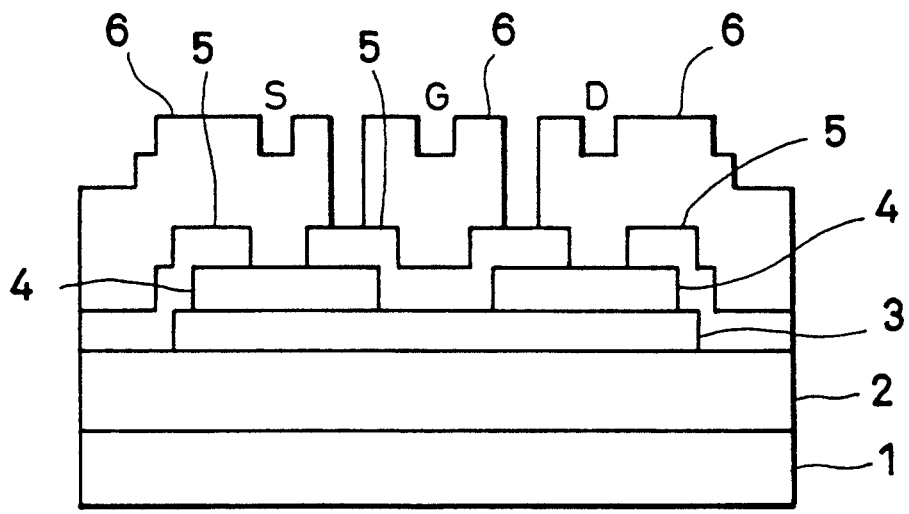

Finally, an aluminum layer of 300 nm thickness was formed by vacuum deposition and then patterned into electrodes 6, whereby a polycrystal silicon thin film transistor (a) as shown in FIG. 4(E) was completed. In FIG. 4(E), S indicates a source electrode, G a gate electrode, and D a drain electrode.

Figure 5:
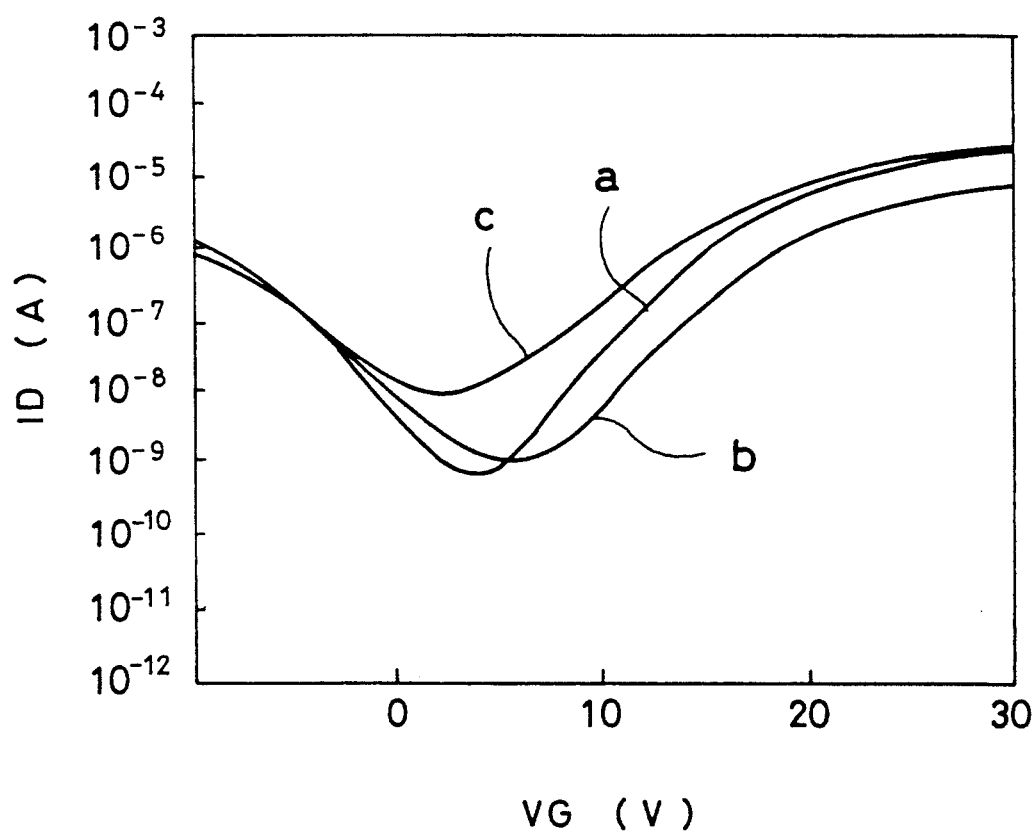
FIG. 5 is a graphical view showing drain current-gate voltage characteristic of a thin film transistor.

For a comparison thereto, another polycrystal silicon thin film transistor (b) was manufactured in the same manner as in the second embodiment, except that an "AN-2" non-alkali glass substrate which had not been heated was utilized instead of the previously heated "AN-2" non-alkali glass substrate. Also, a polycrystal silicon thin film transistor (c) was manufactured in the same manner as in the second embodiment except that a quartz substrate was utilized instead of the previously heated "AN-2" non-alkali glass substrate. $I_D$ (drain current) — $V_G$ (gate voltage) characteristics of thin film transistors (a), (b), and (c) are indicated by curves a, b, and c in FIG. 5. It is apparent from FIG. 5 that the $I_D - V_G$ characteristic of the thin film transistor (a) is improved so much in comparison to that of the thin film transistor (b), and also the electrical property of the transistor (a) is close to that of the thin film transistor (c).

Figure 6:
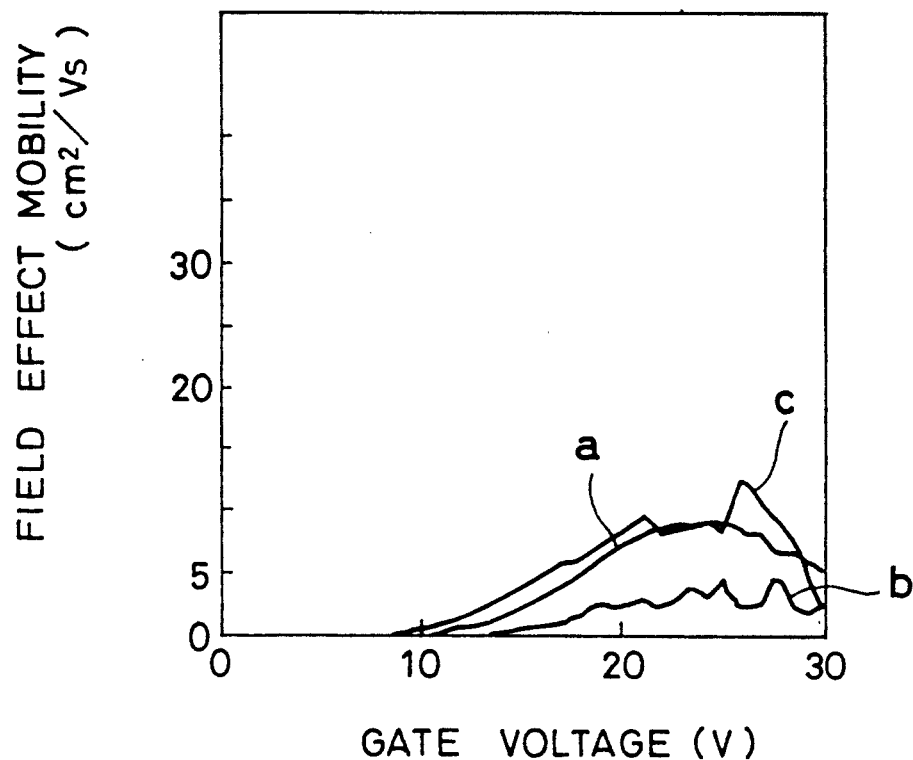
FIG. 6 is a graphical view showing the relationship between gate voltage and field effect mobility in a thin film transistor.
Figure 7:
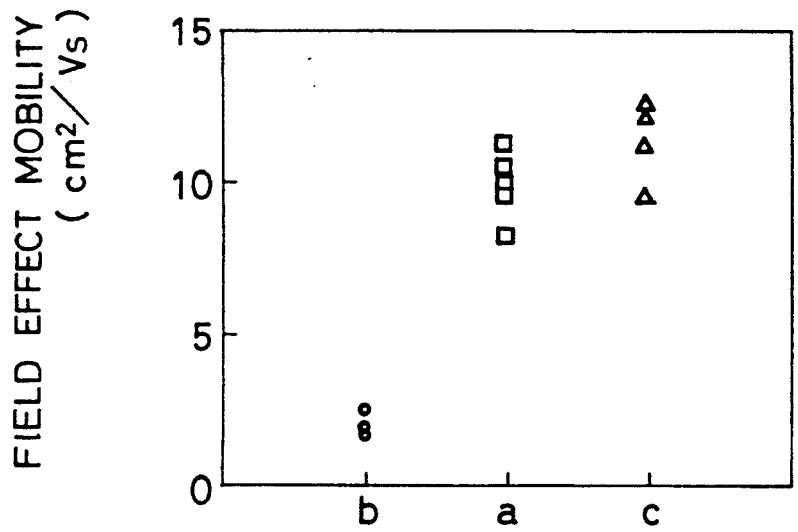
FIG. 7 is a graphical view showing field effect mobility of a thin film transistor.

The relationship between gate voltage and field effect mobility of the thin film transistors (a), (b), and (c) is illustrated in FIG. 6. In FIG. 7 are shown field effect mobilities, where alphabet a indicates the thin film transistor manufactured in accordance with the second embodiment, alphabet b indicates a thin film transistor manufactured in the same manner as that of the above thin film transistor (b), and alphabet c indicates a thin film transistor manufactured in the same manner as that of the above thin film transistor (c). It is found in FIGS. 6 and 7 that the field effect mobility of the thin film transistor a is larger than that of the thin film transistor b and is almost the same as that of the thin film transistor c.

In accordance with a third embodiment of the present invention, formation of a semiconductor layer on a substrate will be described hereinafter.

An "AN-2" non-alkali glass whose strain point is 616° C., was utilized as a substrate. This glass substrate was heated at 610° C. for 12 hours in an electrical furnace. This heating process was carried out in an inactive gas atmosphere, e.g. $N_2$, involving hydrogen at 50% under an atmospheric pressure. Then a silicon compound layer, e.g. $SiO_2$ layer, was formed to be 200 nm thick by magnetron RF sputtering, and subsequently an amorphous silicon layer was formed thereon to be 100 nm thick by means of a magnetron RF sputtering apparatus in an atmosphere of a hydrogen partial pressure of 0.75 mTorr and an argon partial pressure of 3.00 mTorr at an RF power of 400 W, utilizing a target made of silicon. Then the amorphous silicon layer was crystallized by heat at 600° C. for 96 hours.

Figure 8:
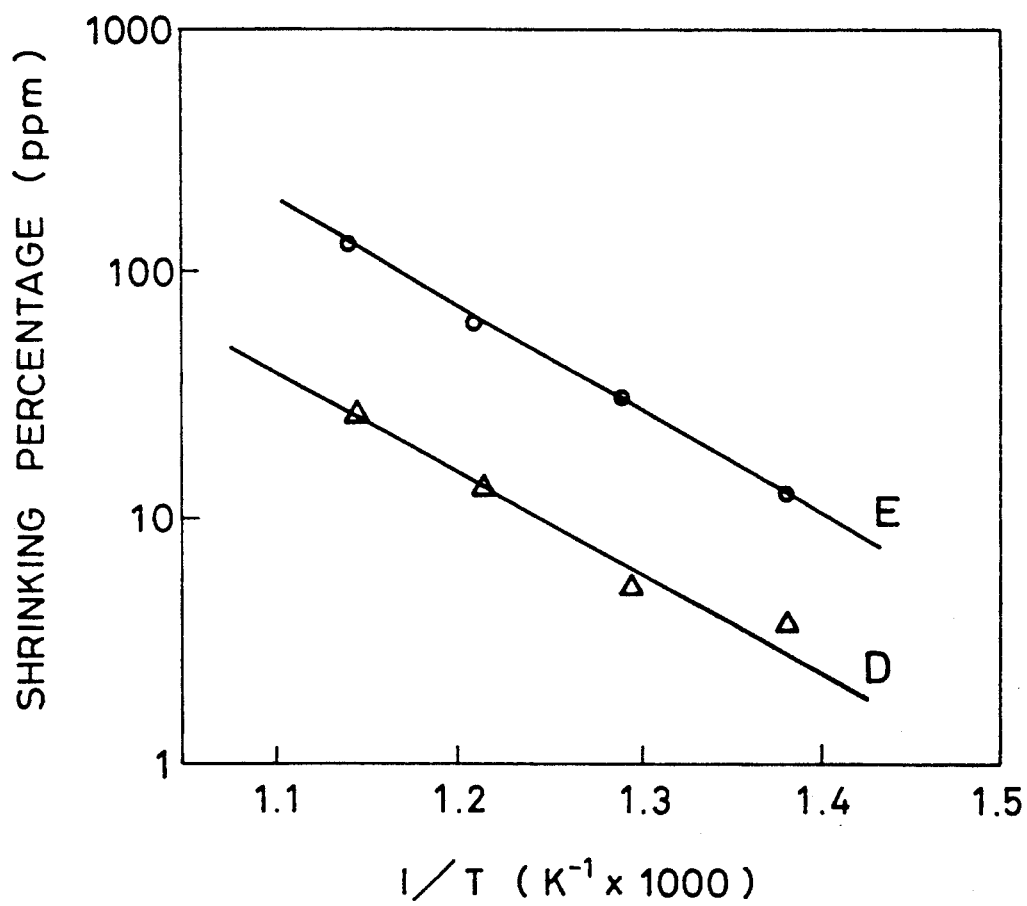
FIG. 8 is another graphical view showing the relationship between shrinking percentage of a glass substrate and temperature.

Shrinking percentages of glass substrates D which had been heated in advance in the same manner as in the third embodiment were measured. Also, those of glass substrates E which had not been heated were also measured. Relationship between shrinking percentages of the glass substrates D and E and temperatures is shown by lines D and E in FIG. 8 respectively. Note the shrinking percentage of each substrate in FIG. 8 was calculated in the same manner as in FIG. 1. As apparent, the shrinking percentages of the heated glass substrates D were far lower than those of the glass substrates E not heated.

Figure 9:
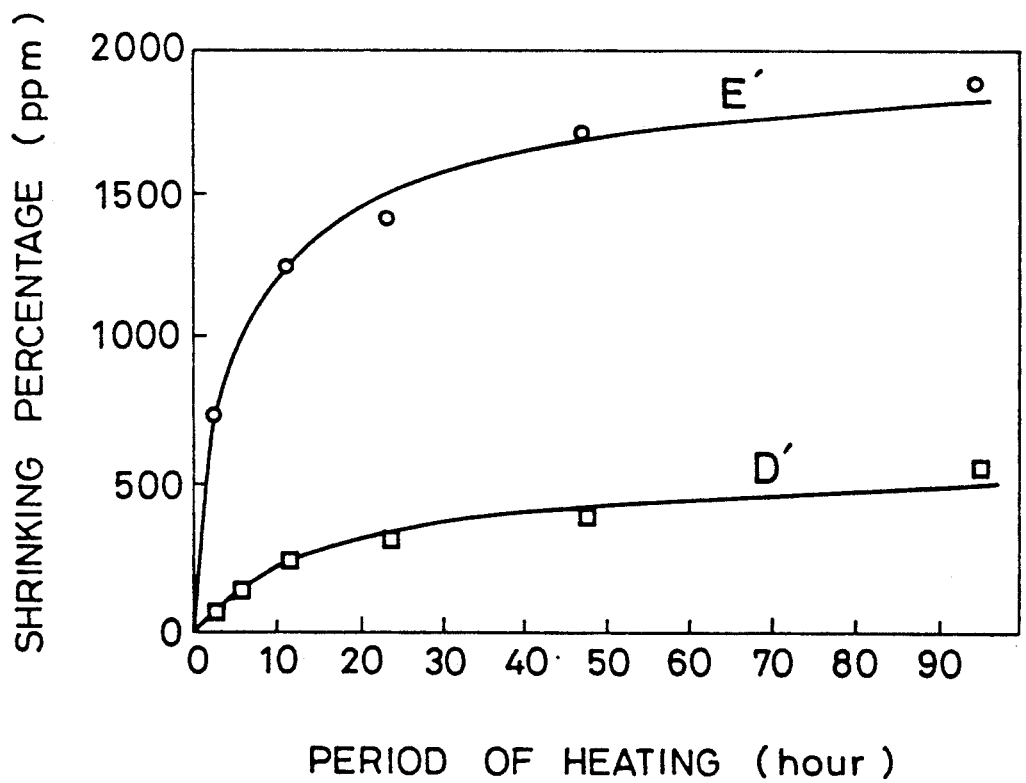
FIG. 9 is another graphical view showing the relationship between shrinking percentage of a glass substrate and period of heating.

Then, relationship between shrinking percentages and periods of heating is examined. Glass substrates D' ("AN-2" non-alkali glass) previously heated in the same manner as in the third embodiment and glass substrates E' ("AN-2" non-alkali glass) which had never been heated were heated at 600° C. The relationship between the shrinking percentages of the substrates D' and E' and the periods of heating is illustrated with curves D' and E' in FIG. 9. Note the shrinking percentage of each substrate in FIG. 9 was calculated in the same manner as in FIG. 2. The result is that, in the case of heating glass substrates for 96 hours, the shrink of the glass substrate E' was about 2000 ppm, while that of the glass substrate D' was only about 500 ppm.

Figure 10:
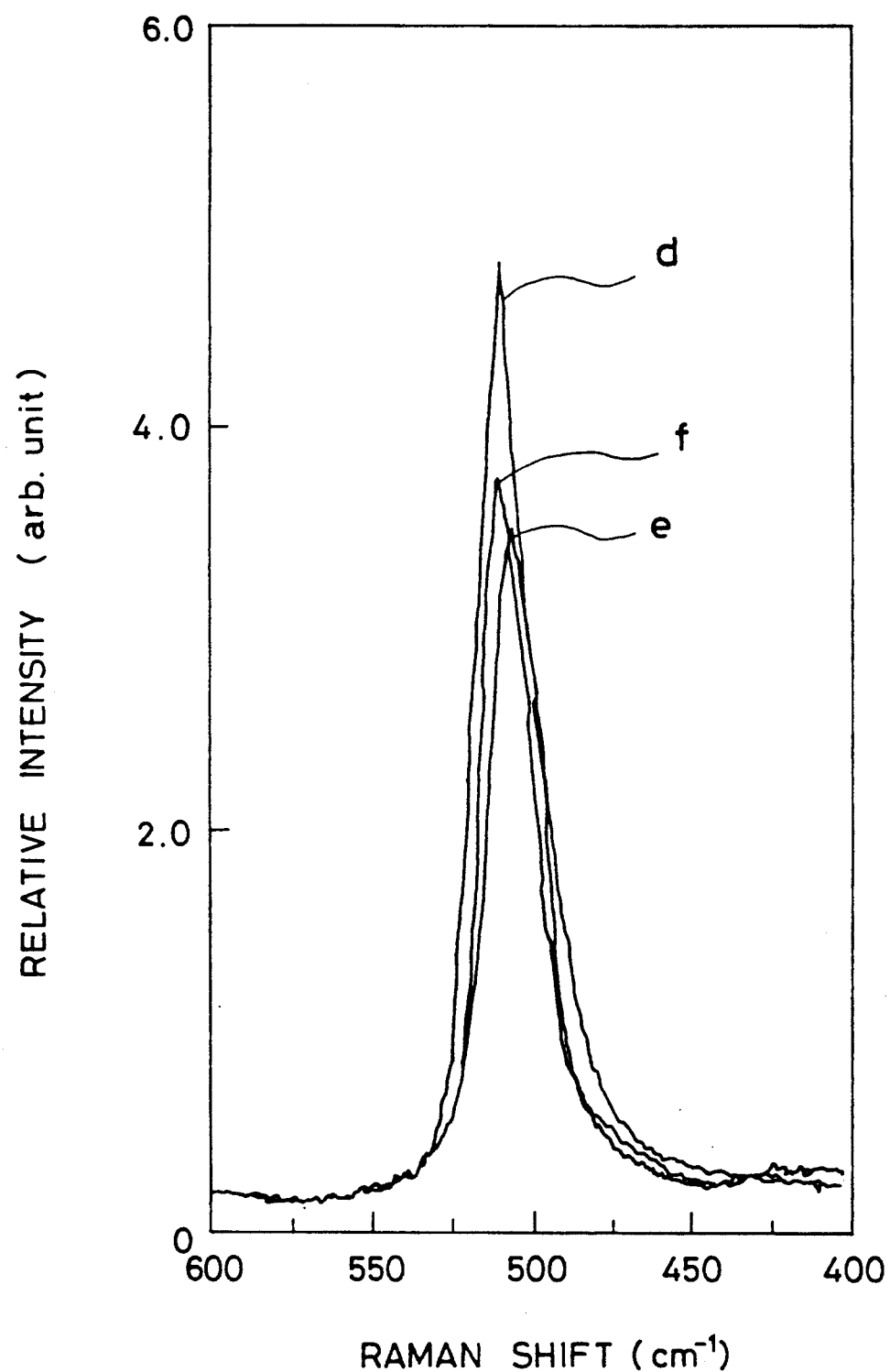
FIG. 10 is another graphical view showing relative intensity in laser Raman spectroscopic analysis for semiconductor layers.

FIG. 10 shows relative intensity in Raman spectroscopic analysis for semiconductor layers. In the figure, curve d indicates that for a silicon semiconductor layer (d) crystallized in accordance with the third embodiment. Also, curve e indicates that for a silicon semiconductor layer (e) which was formed in the same manner as in the third embodiment except that a not heated "AN-2" non-alkali glass substrate was utilized instead of the previously heated "AN-2" non-alkali glass substrate and that an amorphous silicon layer was formed by plasma CVD instead of sputtering method. Further, curve f indicates that for a silicon semiconductor layer (f) which was formed in the same manner as in the third embodiment except that a quartz substrate was utilized instead of the previously heated "AN-2" non-alkali glass substrate and that an amorphous silicon layer was formed by plasma CVD instead of sputtering method. The semiconductor layer (f) was polycrystal. The ordinate in FIG. 10 shows relative strength of crystallinity of semiconductor layers. It is found from FIG. 10 that the crystallinity of the silicon semiconductor layer (d) in accordance with the third embodiment is remarkably high compared with that of the semiconductor layers (e) and (f). The semiconductor layer (d) shows a sharp peak at the same wavenumber as that of the semiconductor layer (f). This means that the silicon semiconductor layer (d) in accordance with the third embodiment as well as the semiconductor layer (f) is polycrystal of high crystallinity.

The semiconductor layer (e) showed a sharp peak at a location slightly different from that of polycrystal silicon, as shown in FIG. 10.

Figure 11:
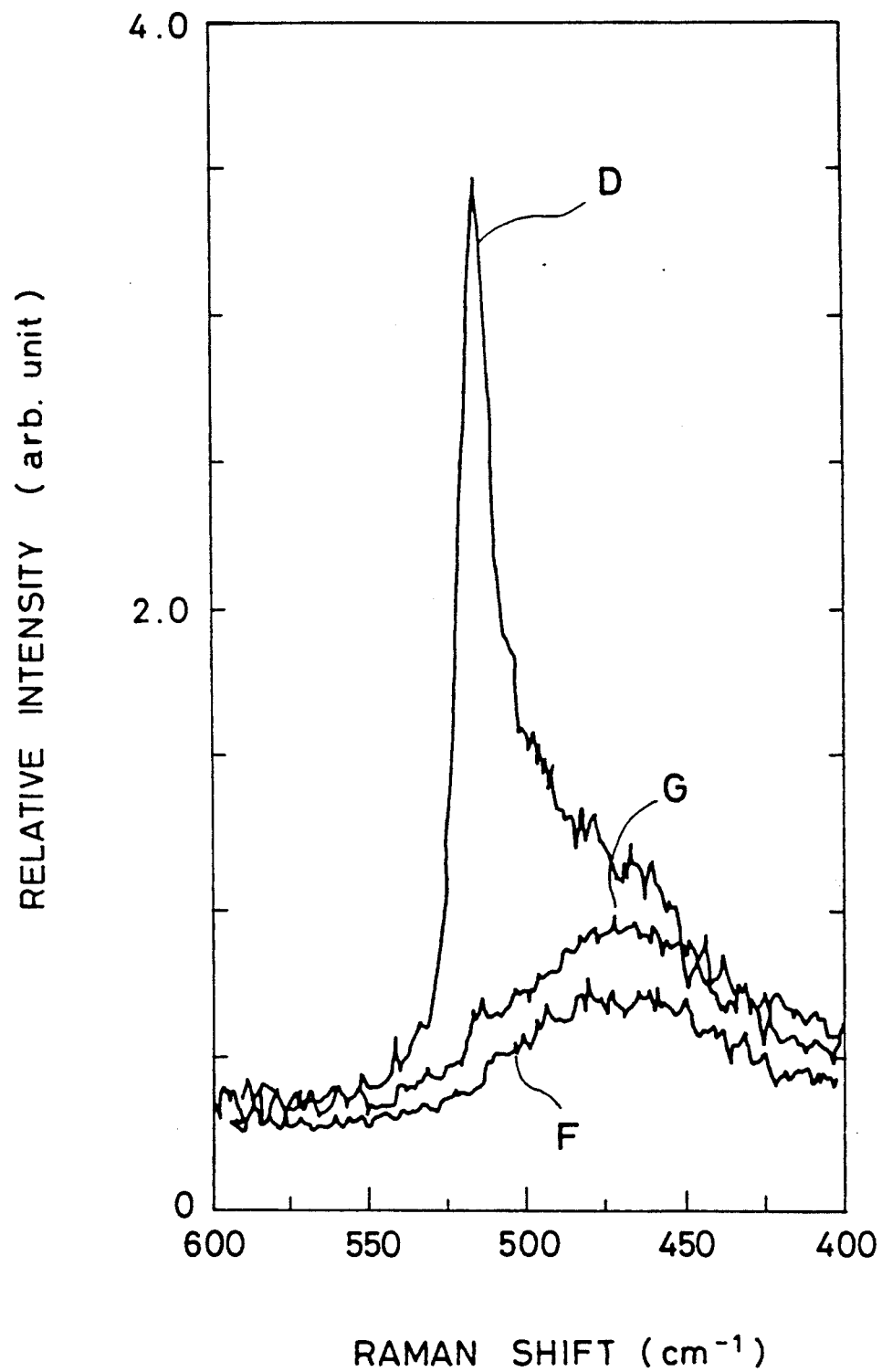
FIG. 11 is still another graphical view showing relative intensity in laser Raman spectroscopic analysis for semiconductor layers.

FIG. 11 shows relative intensity in Raman spectroscopic analysis for semiconductor layers. In the figure, curve D indicates that for a semiconductor layer (d) formed in accordance with the third embodiment. Also, curve F indicates that for a semiconductor layer (F) which was formed in the same manner as in the third embodiment except that hydrogen was not introduced into a magnetron RF sputtering apparatus during formation of an amorphous silicon layer and that argon partial pressure was maintained at 3.75 mTorr in the apparatus during the formation of the amorphous silicon layer. Further, curve G indicates that for a semiconductor layer (G) which was formed in the same manner as in the third embodiment except that hydrogen partial pressure and argon partial pressure were maintained at 0.15 mTorr and 3.50 mTorr respectively in a magnetron Rf sputtering apparatus during formation of an amorphous silicon layer. With respect to the case of F where hydrogen was not introduced and the case of G where hydrogen partial pressure was maintained at 0.15 mTorr, they did not show sharp peaks at a wavenumber of 520 cm$^{-1}$. On the other hand, in the case of the semiconductor layer (d) formed in accordance with the third embodiment, it showed a sharp peak at a wavenumber of 520 cm$^{-1}$, which means the semiconductor layer (d) is polycrystal. It is found from the above result that introducing hydrogen into a magnetron Rf sputtering apparatus during sputtering is preferable. This is because, by introducing hydrogen during sputtering, micro structure is prevented from being formed in the semiconductor layer and thereby crystallization can be carried out with less activation energy. In the case that hydrogen was introduced during sputtering, a semiconductor layer could be crystallized at 800° C. or less.

The glass substrate heating may be carried out under a reduced pressure instead of an atmospheric pressure.

Referring next to FIGS. 12(A) through 12(E), manufacture of a polycrystal silicon thin film transistor will be described in accordance with a fourth embodiment of the present invention.

A glass substrate 11 ("AN-2" non-alkali glass) was cleaned by means of ultrasonic wave. The glass substrate 11 was then heated at 610° C. for 12 hours. The glass substrate heating was carried out in an inactive gas atmosphere, e.g. N$_2$, involving hydrogen at 50% under an atmospheric pressure.

Then a silicon compound layer 12, e.g. SiO$_2$ layer, was formed to be 200 nm thick on the glass substrate 11 by magnetron RF sputtering method. The formation was carried out in an argon atmosphere under a pressure of 0.5 Pa at a temperature of 100° C. at an RF frequency of 13.56 MHz at an RF output power of 400 W.

On the silicon compound layer, an amorphous silicon activation layer 13 was formed to be 100 nm thick by magnetron RF sputtering method. The formation was carried out in an atmosphere of hydrogen partial pressure of 0.75 Torr and argon partial pressure of 3.00 Torr at a temperature of 150° C. at an RF frequency of 13.56 MHz at an RF output power of 400 W.

Then the amorphous silicon layer 13 was crystallized by heat in an inactive gas atmosphere, e.g. N$_2$, under an atmospheric pressure in an electrical furnace for 96 hours at a temperature of 400° to 800° C., typically 500° to 700° C., e.g. 600° C. This crystallization process may be carried out in a hydrogen or carbon monoxide atmosphere or in an inactive gas atmosphere involving hydrogen or carbon monoxide, in order to prevent the amorphous silicon layer from reacting with a gas, e.g. oxygen.

Figure 12A:
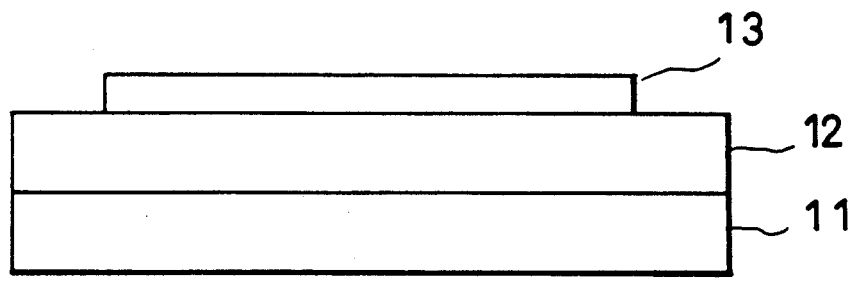
FIGS. 12(A) through (E) are schematic cross sectional views showing a method for manufacturing a thin film transistor in accordance with the present invention.

The crystallized silicon layer 13 was partially removed so that a pattern in FIG. 12(A) was obtained.

Figure 12B:
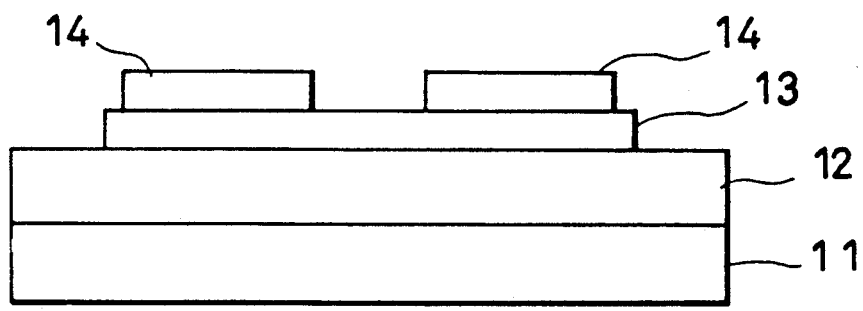
Figure 12C:
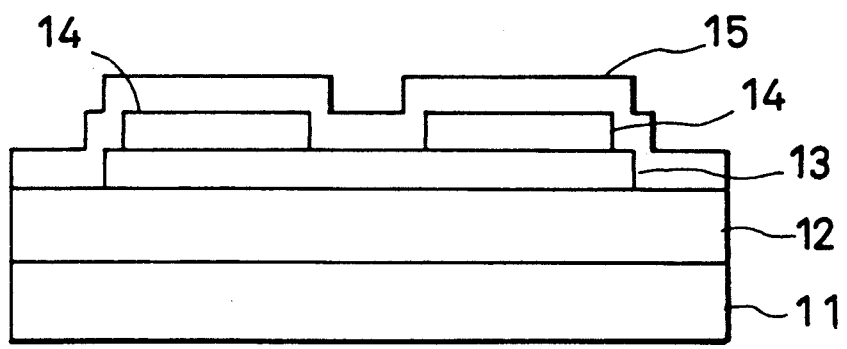

Subsequently, an n$^+$-type amorphous silicon layer 14 was formed to be 50 nm on the silicon layer 13 by magnetron RF sputtering method. The formation was carried out in an atmosphere of hydrogen partial pressure of 0.75 Torr, argon partial pressure of 3.00 Torr and PH$_3$ partial pressure of 0.05 Torr at a temperature of 150° C. at an RF frequency of 13.56 MHz at an RF output power of 400 W. Then the silicon layer 14 was partially removed to obtain a gate region as shown in FIG. 12(B). Then, a gate oxide film (SiO$_2$) 15 was formed to be 100 nm thick by magnetron RF sputtering under a pressure of 0.5 Pa at a temperature of 100° C. at an RF frequency of 13.56 MHz at an RF output power of 400 W as shown in FIG. 12(C).

Figure 12D:
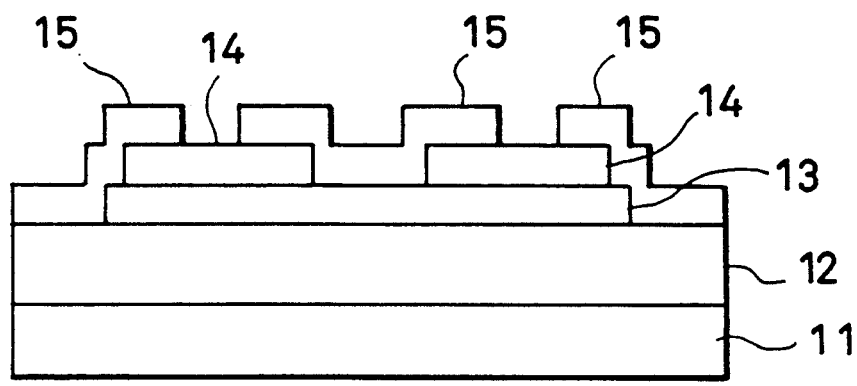

The gate oxide film 15 was then partially removed to thereby form contact holes as shown in FIG. 12(D).

Figure 12E:
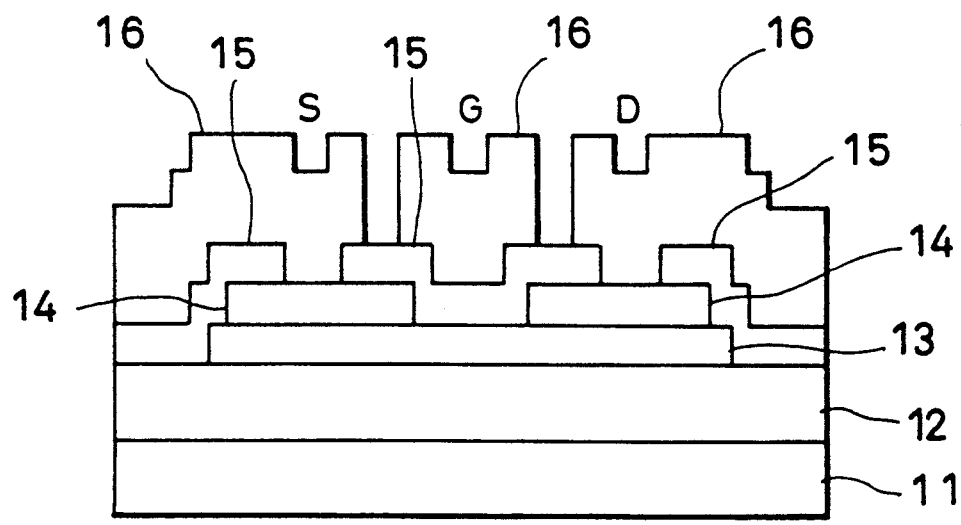

Finally, an aluminum layer of 300 nm thickness was formed by vacuum deposition and then patterned into electrodes 16, whereby a polycrystal silicon thin film transistor shown in FIG. 12(E) was completed. In FIG. 12(E), S indicates a source electrode, G a gate electrode, and D a drain electrode.

Figure 13:
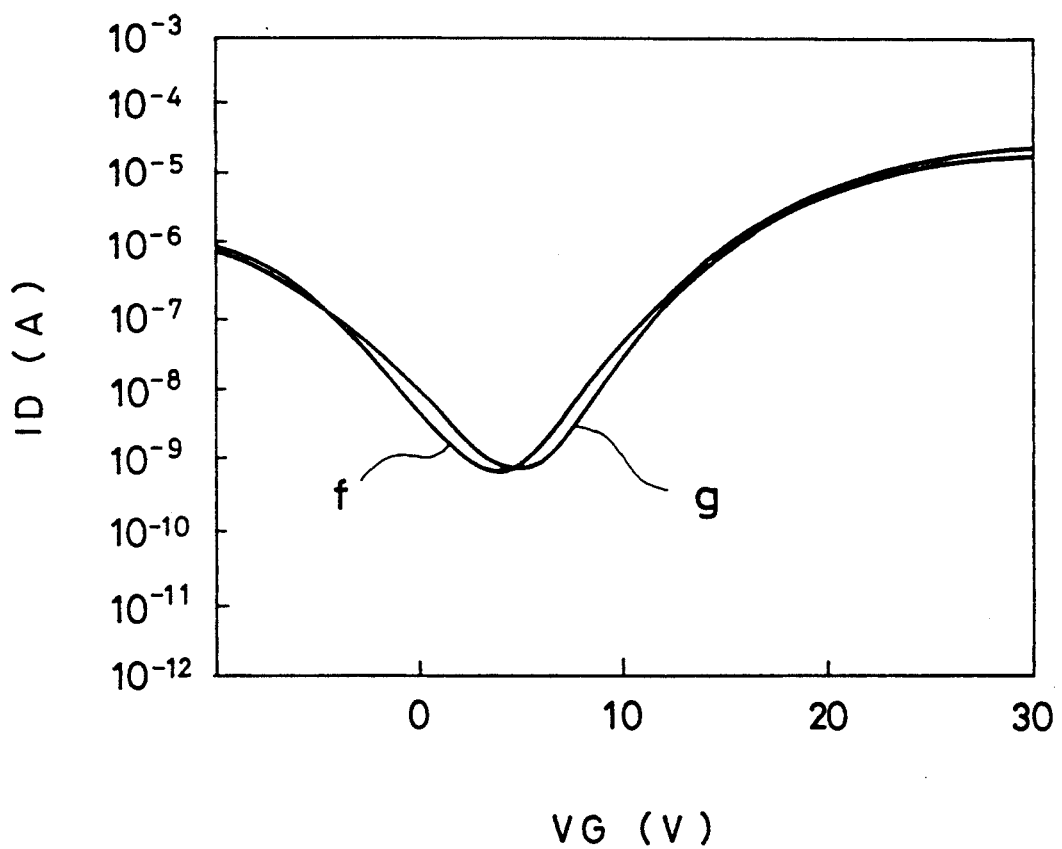
FIG. 13 is another graphical view showing drain current-gate voltage characteristic in a thin film transistor.
Figure 14:
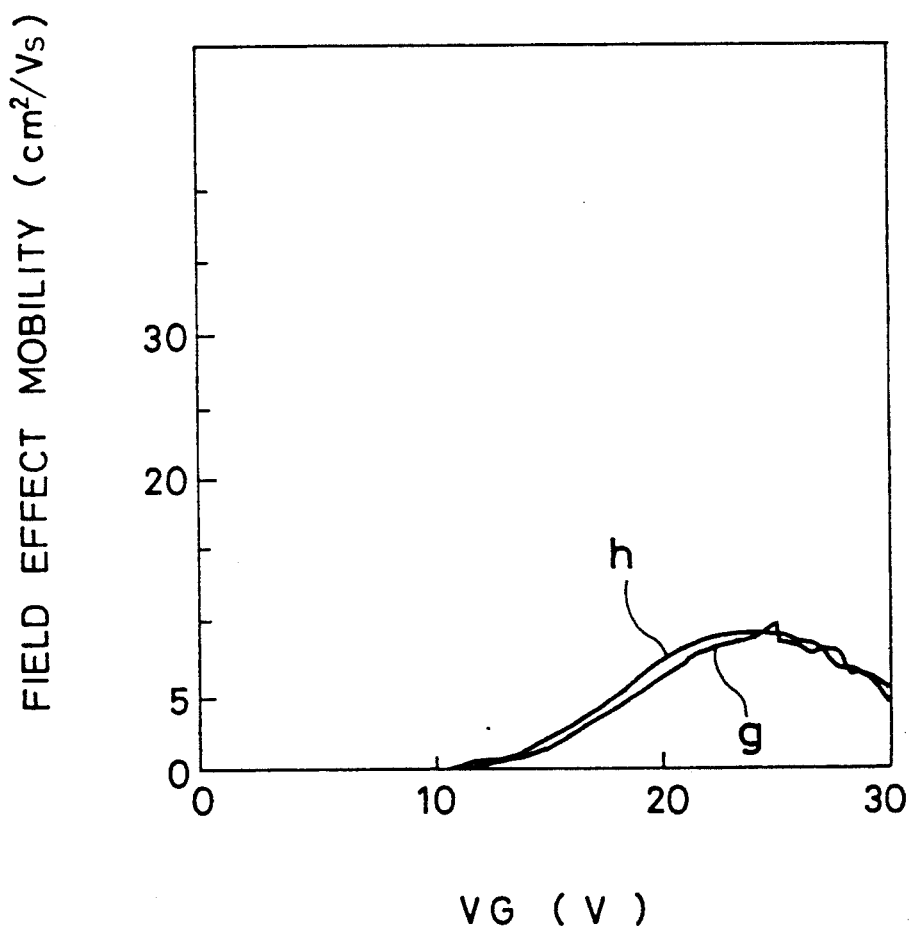
FIG. 14 is another graphical view showing the relationship between gate voltage and field effect mobility in a thin film transistor.

For a comparison thereto, polycrystal silicon thin film transistor (h) was manufactured in the same manner as in the fourth embodiment except that an amorphous silicon activation layer 13 was formed by plasma CVD instead of magnetron RF sputtering method. In FIG. 13 is shown $I_D-V_G$ characteristic of the thin film transistor (h) by curve h. Also, that of a thin film transistor (g) in accordance with the fourth embodiment is shown by curve g. As apparent from FIG. 13, the $I_D-V_G$ characteristics of the above two thin film transistors are very close. Also, relationship between gate voltage $V_G$ and field effect mobility μ with respect to the thin film transistor (g) and that with respect to the thin film transistor (h) are shown by curves g and h in FIG. 14 respectively. As obvious from the figure, field effect mobilities of the two thin film transistors (g) and (h) are very close. From these results, it is recognized that characteristic of the thin film transistor (h) in which the amorphous silicon layer 13 is formed by plasma CVD is almost the same as that of the thin film transistor (g) in accordance with the fourth embodiment.

Figure 15:
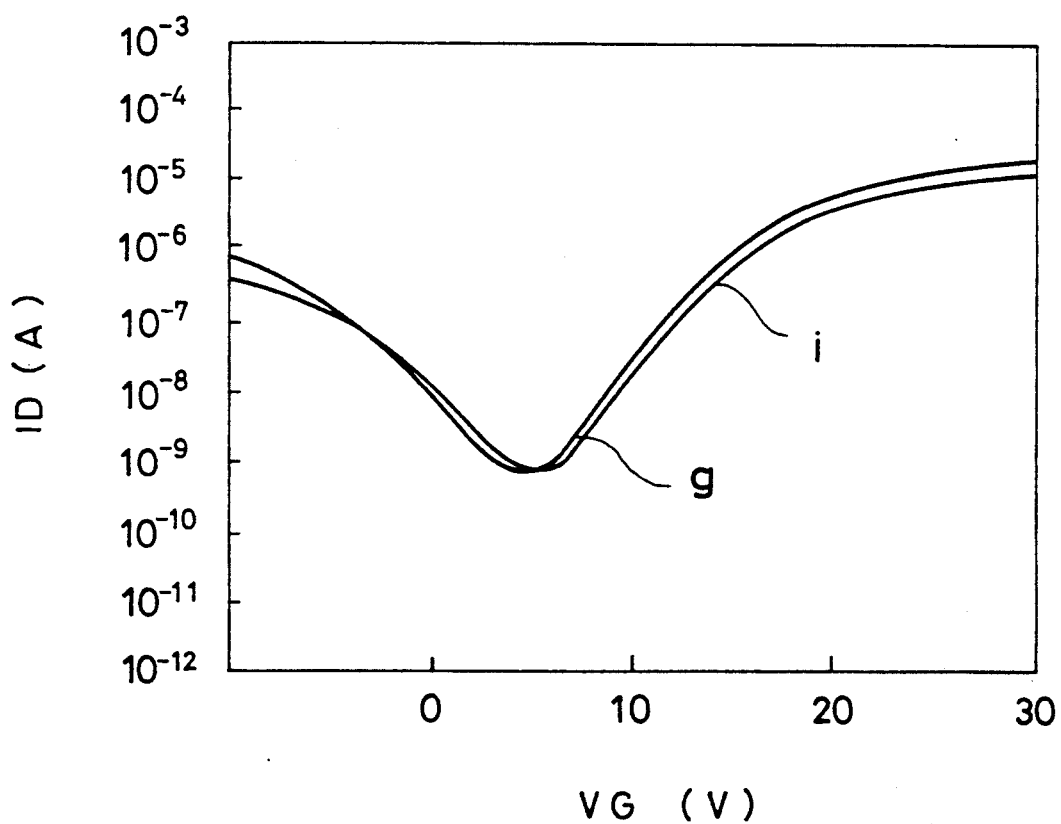
FIG. 15 is still another graphical view showing drain current-gate voltage characteristic in a thin film transistor.

For a further comparison, a polycrystal silicon thin film transistor (i) was manufactured in the same manner as in the fourth embodiment except that a glass substrate was heated in a nitrogen atmosphere to which hydrogen was not added. $I_D-V_G$ characteristic of the thin film transistor (i) is shown by curve i in FIG. 15. That of the thin film transistor (g) in accordance with the fourth embodiment is shown by curve g. It is apparent from FIG. 15 that the characteristic of the thin film transistor (g) is superior to that of the thin film transistor (i). This is because the hydrogen etched oxygen residing on the glass substrate in the thin film transistor (g), and accordingly electrical property of the thin film transistor (g) was not degraded. In the fourth embodiment, heating and cleaning of the glass substrate were carried out in one step. For reducing the number of manufacturing steps, it is preferred to heat a glass substrate in an inactive gas atmosphere involving hydrogen, as explained hereinbefore. Carbon monoxide also functions to clean up oxygen on a glass substrate, so that the glass substrate heating may be carried out in an inactive gas atmosphere involving carbon monoxide.

Referring next to FIGS. 16(A) through 16(E), manufacture of a polycrystal silicon thin film transistor of coplanar type in accordance with a fifth embodiment of the present invention will be described.

A glass substrate ("AN-2" non-alkali glass) 21 was heated at 610° C. for 12 hours in an electrical furnace. This heating was carried out in an inactive gas atmosphere, e.g. $N_2$, under an atmospheric pressure. The glass substrate heating may be carried out in a hydrogen or a carbon monoxide atmosphere or in an inactive gas atmosphere involving hydrogen or carbon monoxide.

A silicon compound layer, e.g. $SiO_2$ layer, 22 was formed to be 200 nm by RF sputtering under a pressure of 0.5 Pa at a temperature of 100° at an RF frequency of 13.56 MHz at an RF output power of 400 W.

On the silicon compound layer 22, an amorphous silicon activation layer 23 of 100 nm thickness was formed by RF sputtering under a pressure of 0.5 Pa at a temperature of 150° C. at an RF frequency of 13.56 MHz at an RF output power of 400 W.

The amorphous silicon layer 23 was then crystallized by heat at a temperature of 400° C. to 800° C., typically 500° C. to 700° C., e.g. 600° C., for 96 hours in a nitrogen atmosphere involving carbon monoxide at 50%. This crystallization was carried out in an electrical furnace under an atmospheric pressure or a reduced pressure. Since carbon monoxide oxidized oxygen residing on the glass substrate, the amorphous silicon layer 23 was not affected by oxygen. The crystallization process may be carried out by irradiating partially the silicon layer 23 with laser so that the temperature of the silicon layer 23 is 400° C. to 800° C. In this case, at least a portion of the silicon layer 23 irradiated with laser is crystallized to be utilized as a channel region.

Figure 16A:
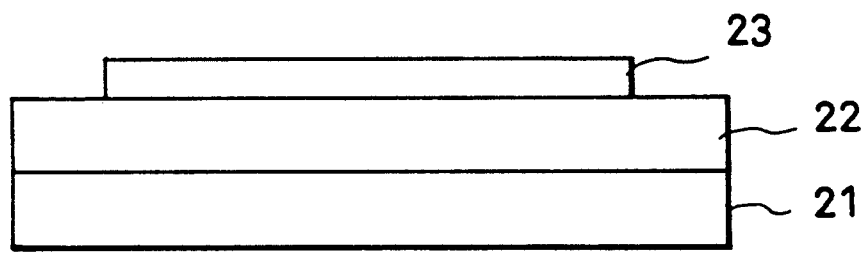
FIGS. 16(A) through (E) are schematic cross sectional views showing a method for manufacturing a thin film transistor in accordance with the present invention.

Then, the crystallized silicon layer 23 was partially removed to form a pattern in FIG. 16(A). Reference numeral 23 in FIG. 16 designates a channel region formed of the crystallized silicon layer.

Figure 16B:
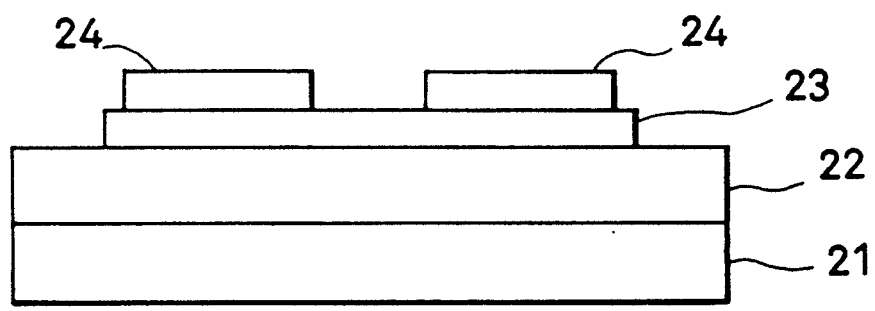

An $n^+$-type amorphous silicon layer 24 was formed to be 50 nm thick by PCVD method under a pressure of 6.65 Pa at a temperature of 350° C. at an RF frequency of 13.56 MHz at an RF output power of 400 W at a ratio of $PH_3$ (5%): $SiH_4$: $H_2=0.2$ SCCM: 0.3 SCCM: 50 SCCM. The amorphous silicon layer 24 was partially removed to form a gate region as shown in FIG. 16(B).

Figure 16C:
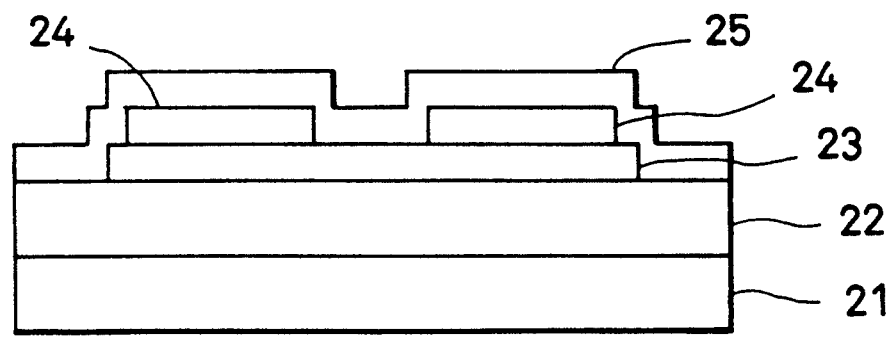
Figure 16D:
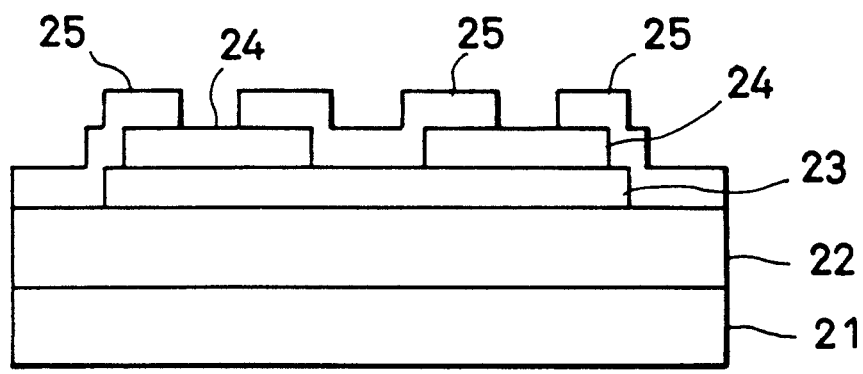

Then, a gate oxide film ($SiO_2$) 25 of 100 nm thickness was formed by sputtering under a pressure of 0.5 Pa at a temperature of 100° C. at an RF frequency of 13.56 MHz at an RF output power of 400 W as shown in FIG. 16(C). The gate oxide film 25 was then partially removed to form contact holes as shown in FIG. 16(D).

Figure 16E:
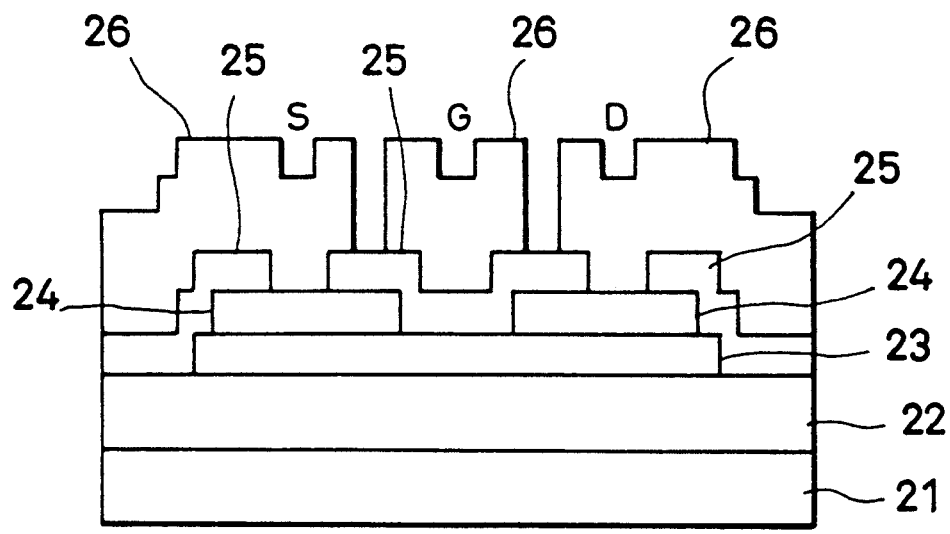

Finally, an aluminum layer of 300 nm thickness was formed by vacuum deposition and then patterned into electrodes 26, and a polycrystal silicon thin film transistor (j) shown in FIG. 16(E) was thus completed. In FIG. 16(E), S is a source electrode, G a gate electrode, and D a drain electrode.

Figure 17:
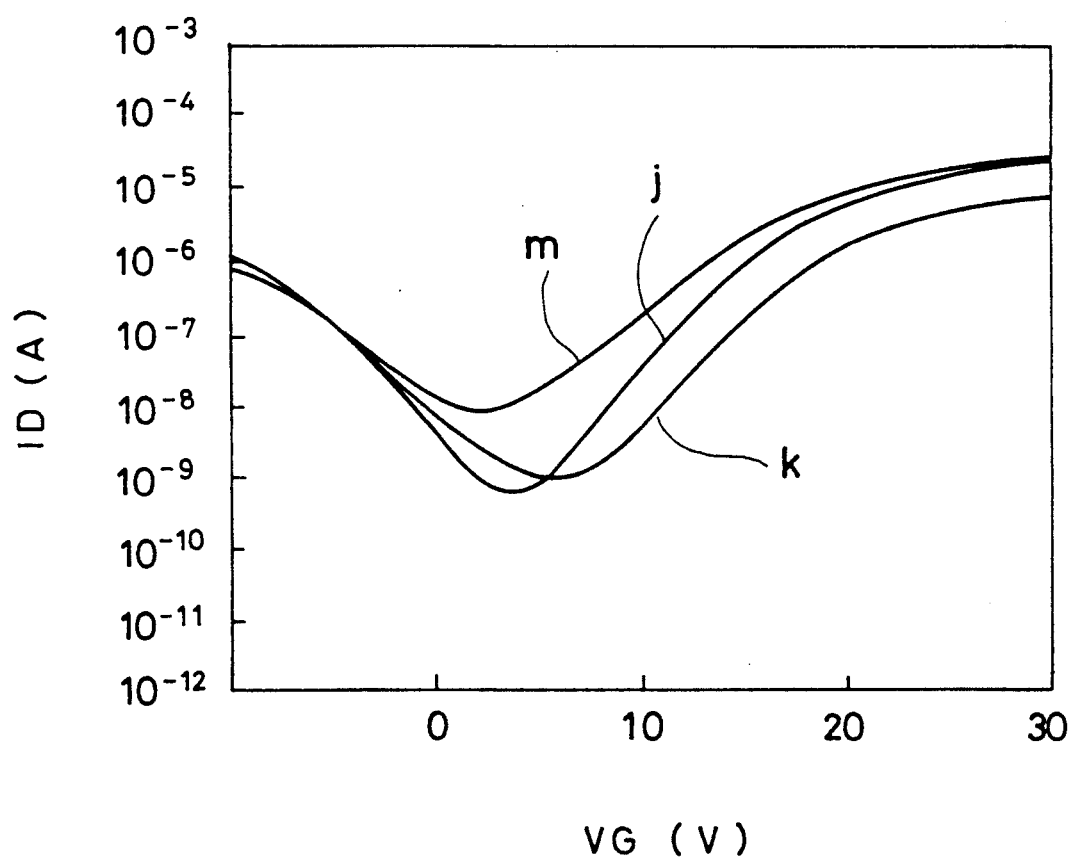
FIG. 17 is a further graphical view showing drain current-gate voltage characteristic in a thin film transistor.

For a comparison thereto, a polycrystal silicon thin film transistor (k) was manufactured in the same manner as in the fifth embodiment except that a not heated glass substrate ("AN-2" non-alkali glass) was utilized instead of the previously heated "AN-2" non-alkali glass substrate. Also, a polycrystal silicon thin film transistor (m) was manufactured in the same manner as in the fifth embodiment except that a quartz substrate was utilized instead of the previously heated "AN-2" non-alkali glass substrate. $I_D-V_G$ characteristics of the thin film transistors (j), (k), and (m) are shown by curves j, k, and m in FIG. 17 respectively. It is found from the figure that the $I_D-V_G$ characteristic of the thin film transistor (j) in accordance with the fifth embodiment is far improved compared with the thin film transistor (k) utilizing a not heated glass substrate. Electrical property of the thin film transistor (j) is close to that of the thin film transistor (m) formed on a quartz substrate.

Figure 18:
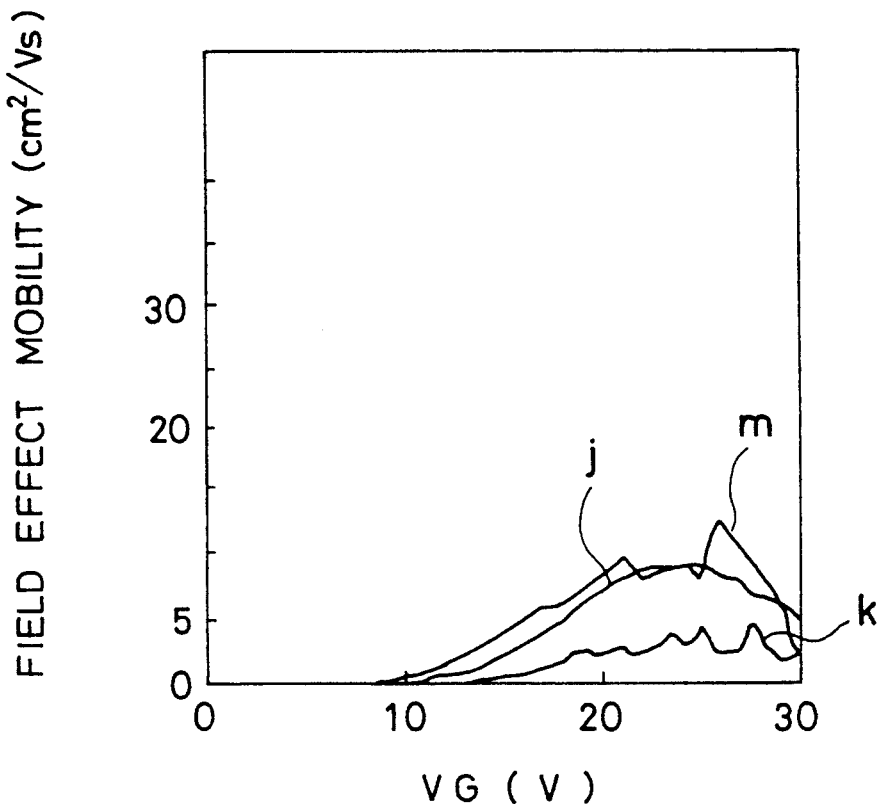
FIG. 18 is still another graphical view showing the relationship between gate voltage and field effect mobility in a thin film transistor.
Figure 19:
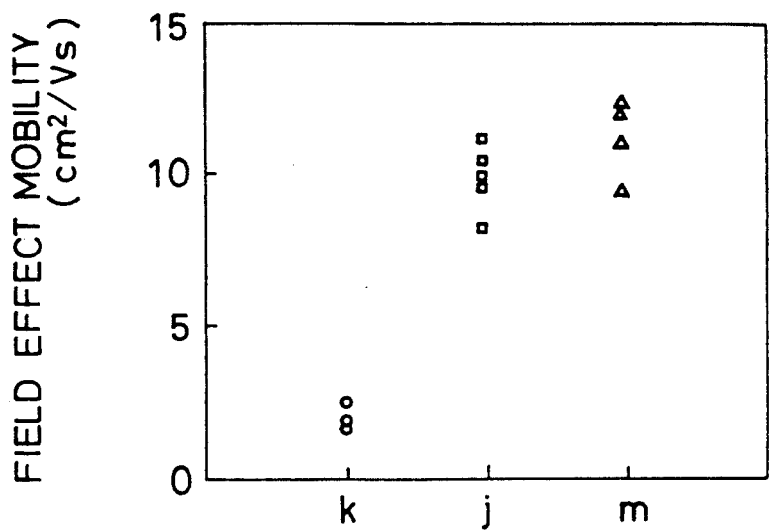
FIG. 19 is another graphical view showing field effect mobility of a thin film transistor.

FIG. 18 shows relationship between gate voltage $V_G$ and field effect mobility μ of the thin film transistor (j), (k), and (m). FIG. 19 shows field effect mobility μ, where alphabet j indicates a thin film transistor manufactured in the same manner as that of the thin film transistor (j), alphabet k indicates a thin film transistor manufactured in the same manner as that of the thin film transistor (k), and alphabet m indicates a thin film transistor manufactured in the same manner as that of the thin film transistor (m). As apparent from FIGS. 18 and 19, the field effect mobilities μ of the thin film transistors (j) in accordance with the fifth embodiment are higher than those of the thin film transistors (k) manufactured on not heated "AN-2" non-alkali glass substrates and are almost the same as those of the thin film transistors (m) manufactured on quartz substrates.

Figure 20:
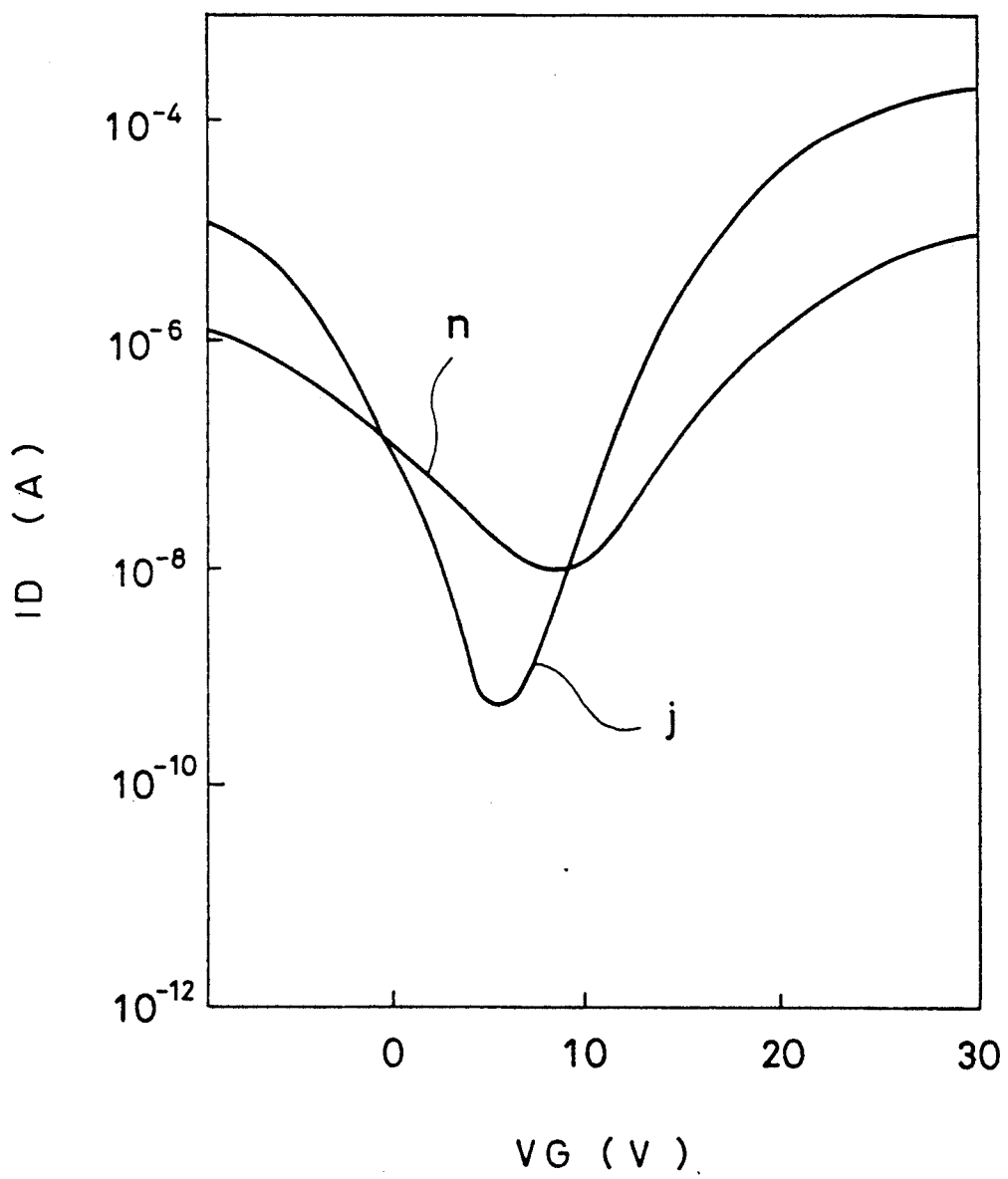
FIG. 20 is a still further graphical view showing drain current-gate voltage characteristic in a thin film transistor.

For a further comparison, thin film transistors (n) were manufactured in the same manner as in the fifth embodiment except that the amorphous silicon layer 23 was crystallized in an atmosphere of 100% nitrogen instead of the nitrogen atmosphere involving carbon monoxide at 50%. In these thin film transistors (n), field effect mobility exceeding 100 cm$^{-2}$/V$_s$ could not be obtained. To the contrary, with respect to the thin film transistors manufactured in accordance with the fifth embodiment, 10% or higher of all the products had field effect mobility exceeding 120 cm$^{-2}$/V$_s$. In FIG. 20, I$_D$–V$_G$ characteristics of the thin film transistors (j) and (n) are shown by curves j and n. As apparent from FIG. 20, the thin film transistor (j) manufactured in accordance with the fifth embodiment is superior to the thin film transistor (n).

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. For example, a non-single crystal semiconductor layer may be formed on a glass substrate by chemical vapor deposition method, vacuum deposition method, ion cluster beam method, MBE (molecular beam epitaxy) method, laser abrasion method, and the like. A polycrystal semiconductor layer of high crystallinity can be obtained from the non-single crystal semiconductor layer by the method of the present invention. Also, thin film transistors of stagger type, inverse stagger type, and inverse coplanar type may be manufactured by the method of the present invention. A glass substrate may be heated in a photo CVD apparatus equipped with heating means, instead of an electrical furnace. In this case, hydrogen is introduced and activated in the photo CVD apparatus during the heating, to thereby enhance the cleaning of a substrate surface.

Further, a silicon nitride layer, a silicon carbide layer, a silicon oxide layer, a silicon oxinitride layer, or a multilayer comprising some of the above layers may be provided on a glass substrate as a blocking layer, instead of the blocking layer used in embodiments of the present invention. By the provision of such a blocking layer, it can be avoided for alkali ions residing in a glass substrate to enter a device to be formed on the substrate.

In the foregoing embodiments, a blocking layer is formed on a heated substrate. However, a semiconductor device of the present invention may be manufactured by forming a blocking layer on a glass substrate followed by heating the glass substrate provided with the blocking layer. Also, "LE-30" comprising SiO$_2$ (60%), Al$_2$O$_3$ (15%), B$_2$O$_3$ (6%), and R$_2$O (2%) manufactured by HOYA Corporation, "TRC-5" comprising SiO$_2$, Al$_2$O$_3$, and ZnO manufactured by Ohara Inc., and "N-O" manufactured by Nippon Electric Glass Co., Ltd. may be used instead of "AN-2" non-alkali glass.

What is claimed is:

1. In a method for manufacturing a semiconductor device comprising the steps of forming a non-single crystal semiconductor layer on a glass substrate and crystallizing said non-single crystal semiconductor layer, the improvement comprising:

heating said glass substrate at a temperature not higher than strain point of said glass substrate before forming said non-single crystal semiconductor layer in an atmosphere comprising a gas selected from the group consisting of hydrogen gas and carbon monoxide gas;.

2. The method of claim 1 wherein said atmosphere further includes a nitrogen gas.

3. The method of claim 1 wherein said crystallizing step is carried out in an atmosphere comprising at least one of an inactive gas, nitrogen, hydrogen, and carbon monoxide.

4. In a method for manufacturing a semiconductor device comprising the steps of forming a non-single crystalline semiconductor layer on a glass substrate and crystallizing said non-single crystalline semiconductor layer at a temperature from 400° C. to 800° C., the improvement comprising:

heating said glass substrate before forming said non-single crystal semiconductor layer in an atmosphere comprising a gas selected from the group consisting of hydrogen gas or carbon monoxide gas 5. The method of claim 4 wherein said atmosphere further includes a nitrogen gas.

6. The method of claim 4 wherein said crystallizing step is carried out in an atmosphere comprising at least one of an inactive gas, nitrogen, and carbon monoxide.

7. The method of claim 4 wherein said inactive gas comprises argon.

8. The method of claims 1 or 4 wherein a silicon compound layer is formed on said glass substrate either before or after said preheating the glass substrate but before forming said non-single crystal semiconductor layer.

9. The method of claim 8 wherein said silicon compound layer comprises a compound selected from the group consisting of silicon oxide silicon nitride, silicon carbide, and silicon oxynitride.

10. In a method for manufacturing a semiconductor device on a glass substrate comprising at least a non-single crystal semiconductor layer, the improvement comprising preheating said glass substrate in an atmosphere comprising at least hydrogen or carbon monoxide before forming said non-single crystal semiconductor layer in order to minimize the thermal contraction of said substrate during the formation of said semiconductor layer.

11. The method of claim 10 wherein said non-single crystal semiconductor is formed by depositing a non-single crystal semiconductor layer by a vapor deposition method and crystallizing said layer by heating.

* * * * *